United States Patent
Yano et al.

(10) Patent No.: US 7,441,590 B2
(45) Date of Patent: Oct. 28, 2008

(54) RADIATOR FOR SEMICONDUCTOR

(75) Inventors: Hiroshi Yano, Kariya (JP); Kenji Shimomura, Chita-gun (JP)

(73) Assignee: Denso Corporation, Kariya (JP)

( * ) Notice: Subject to any disclaimer, the term of this patent is extended or adjusted under 35 U.S.C. 154(b) by 305 days.

(21) Appl. No.: 11/334,724

(22) Filed: Jan. 19, 2006

(65) Prior Publication Data
US 2006/0169437 A1    Aug. 3, 2006

(30) Foreign Application Priority Data
Feb. 2, 2005    (JP) .............................. 2005-026442

(51) Int. Cl.
*H05K 7/20*    (2006.01)
(52) U.S. Cl. ..................... 165/80.2; 165/122; 165/80.3; 361/697
(58) Field of Classification Search ................ 165/80.3, 165/121, 122, 185; 361/697
See application file for complete search history.

(56) References Cited

U.S. PATENT DOCUMENTS

| | | | | |
|---|---|---|---|---|
| 5,597,034 A * | 1/1997 | Barker et al. | ............... | 165/80.3 |
| 6,109,340 A * | 8/2000 | Nakase et al. | .............. | 165/80.3 |
| 6,381,836 B1 * | 5/2002 | Lauruhn et al. | ............... | 29/831 |
| 6,411,510 B2 * | 6/2002 | Sasa et al. | .................... | 361/697 |
| 6,504,712 B2 | 1/2003 | Hashimoto et al. | | |
| 6,538,888 B1 * | 3/2003 | Wei et al. | ..................... | 361/697 |
| 6,788,536 B2 * | 9/2004 | Lai et al. | .................... | 361/697 |
| 7,237,599 B2 * | 7/2007 | Lopatinsky et al. | ........ | 165/80.3 |
| 7,281,893 B2 * | 10/2007 | Pan | ............................ | 415/177 |
| 2003/0024688 A1 * | 2/2003 | Dowdy et al. | .............. | 165/80.3 |

FOREIGN PATENT DOCUMENTS

| | | |
|---|---|---|
| CN | 1567574 | 1/2005 |
| JP | A-2000-104697 | 4/2000 |
| JP | A-2000-323875 | 11/2000 |

OTHER PUBLICATIONS

Office Action dated Feb. 1, 2008 in corresponding Chinese Patent Application No. 2006100069337 (and English translation).

* cited by examiner

*Primary Examiner*—Allen J Flanigan
(74) *Attorney, Agent, or Firm*—Posz Law Group, PLC

(57) ABSTRACT

A radiator for a semiconductor includes a main body which is provided for radiating heat from the semiconductor mounted to a substrate, and a plate member attached to the main body. The plate member is provided to have an elasticity relative to the substrate. The plate member includes a plate portion that covers a part of one surface of the main body, opposite to the substrate, and four leg portions each of which extends from an outer periphery of the plate portion and is fixed to the substrate. In the radiator, the plate member effectively absorbs stress applied to the substrate.

20 Claims, 4 Drawing Sheets

RADIATOR FOR SEMICONDUCTOR

CROSS REFERENCE TO RELATED APPLICATION

This application is based on Japanese Patent Application No. 2005-26442 filed on Feb. 2, 2005, the contents of which are incorporated herein by reference in its entirety.

FIELD OF THE INVENTION

The present invention relates to a radiator for a semiconductor.

BACKGROUND OF THE INVENTION

A radiator for radiating a semiconductor is generally provided with a fan for effectively performing a radiation of the semiconductor. In this case, it is necessary to tightly fix the radiator to a substrate to which the semiconductor is mounted. However, a mounting position provided on the substrate, for mounting the radiator, may be shifted from a mounting position provided on the radiator. Accordingly, when the radiator is fixed to the substrate by using screws, a large stress may be applied to the substrate, and the substrate may be bent and deformed due to the stress. In this case, a soldering portion of the semiconductor to the substrate may be cracked.

A spring member can be additionally used at a connection portion between the radiator and the substrate. In this case, the stress applied to the substrate to which the radiator is attached can be reduced using the spring deformation of the spring member. However, the number of the components of the radiator is increased due to the additional use of the spring member.

SUMMARY OF THE INVENTION

In view of the above-described problems, it is an object of the present invention to reduce a stress applied to a substrate, caused due to attachment of a radiator.

It is another object of the present invention to reduce the number of components in the radiator while reducing a stress applied to the substrate when the radiator is mounted to the substrate.

According to an aspect of the present invention, a radiator includes a main body which is provided for radiating heat from a semiconductor mounted to a substrate, and a plate member attached to the main body. The plate member is provided to have an elasticity relative to the substrate. Furthermore, the plate member includes a plate portion that covers a part of one surface of the main body, opposite to the substrate, and a leg portion extending from an outer periphery of the plate portion and fixed to the substrate. For example, the one surface of the main body is a top surface of the main body mounted to the substrate. Accordingly, the plate member effectively reduces a stress applied to the substrate, while the number of components of the radiator can be effectively reduced.

Hear, the elasticity of the plate member is a flexibility by which the plate member can be effectively deformable relative to the substrate, when the plate member is attached to the substrate. Therefore, it effectively restrict a deformation of the substrate without using an additional spring member.

The leg portion has a base part at a boundary with the plate portion, and the plate portion has a slit recessed from the outer periphery of the plate portion at least at an end of the base part. In this case, the flexibility of the plate member can be further increased.

Furthermore, the leg portion can be bent relative to the plate portion on the outer periphery of the plate portion. In this case, the leg portion can be bent approximately perpendicularly to a plate surface of the plate portion.

For example, the leg portion includes a first plate elongated in a direction horizontal with a plate surface of the plate portion. In this case, a plate surface of the first plate can be approximately perpendicularly to the plate surface of the plate portion, or can be approximately horizontal with the plate surface of the plate portion. Furthermore, the first plate can be provided adjacent to and to face a side surface of the main body. The leg portion further includes a second plate bent relative to the first plate to have a plate surface on the same surface as the plate surface of the first plate, and a third plate bent relative to the plate surface of the second plate to be attached to the substrate. Alternatively, a second plate of the leg portion can be bent relative to the first plate to have a plate surface approximately perpendicular to the plate surface of the first plate.

When the outer periphery of the plate portion has approximately a square shape, four leg portions can be fixed to the substrate at four positions separated from a center by the same distance. In this case, the radiator can be easily mounted to the substrate with a simple structure.

BRIEF DESCRIPTION OF THE DRAWINGS

The above and other objects, features and advantages of the present invention will become more apparent from the following detailed description of preferred embodiments made with reference to the accompanying drawings, in which.

DETAILED DESCRIPTION OF PREFERRED EMBODIMENTS

First Embodiment

Figure 1:
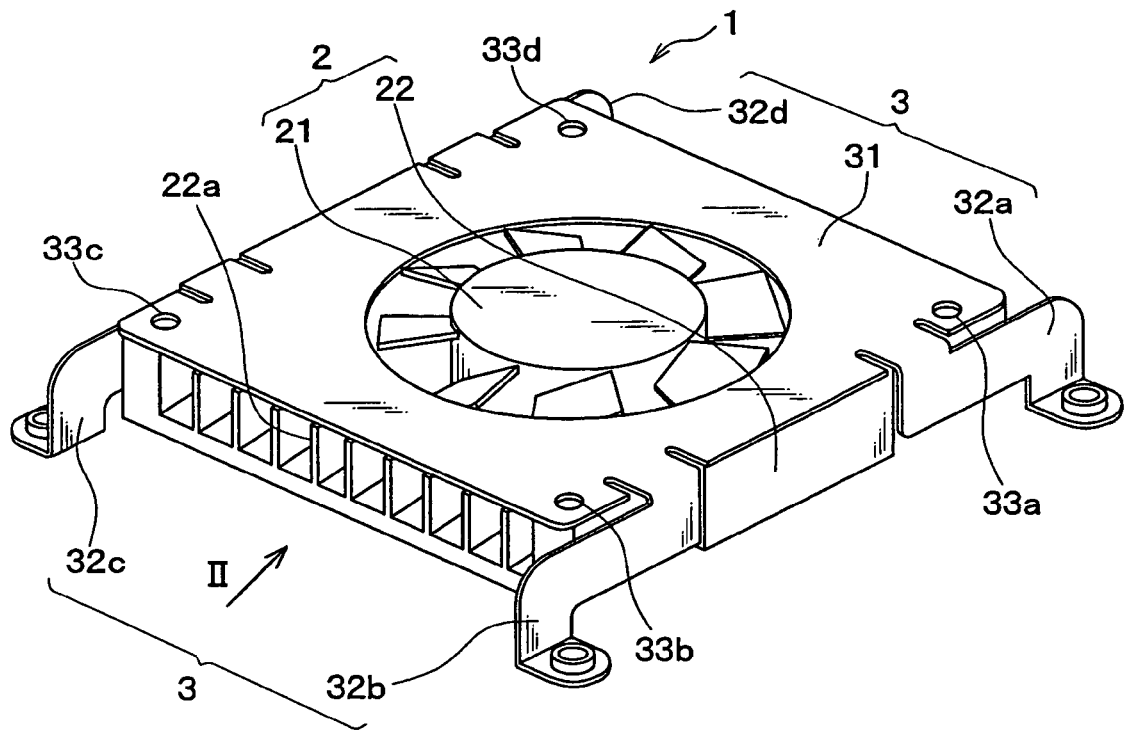
FIG. 1 is a perspective view showing a radiator according to a first embodiment of the present invention.

The first embodiment will be described with reference to FIGS. 1-4. A radiator 1 shown in FIG. 1 is attached to a radiation portion (e.g., top portion) of a semiconductor such as an IC chip 11 incorporated into an electronic machine to cover this radiation portion. The radiator 1 is a device for effectively radiating heat generated from the semiconductor. As shown in FIG. 1, the radiator 1 includes a main body 2 having approximately a rectangular outer peripheral shape (e.g., square shape), and a plate member 3 attached to enclose a part of one surface of the main body 2, opposite to the semiconductor, and a side surface of the main body 2.

The main body 2 includes a fan 21 rotating by a driving force of a motor (not shown), and a casing 22 surrounding a side surface of the fan 21 to support the fan 21 from its bottom. Outlet ports 22a are provided at a side portion of an outer peripheral surface of the casing 22. Therefore, when the fan 21 rotates, air drawn from an upper side (axial side) of the fan 21 is discharged radially outside from the outlet ports 22a.

The plate member 3 is constructed with a top plate portion 31 and four leg portions 32a-32d. The top plate portion 31 is a plate portion disposed to cover one surface (e.g., top surface in FIG. 1) of the casing 22. An inner periphery of the top plate portion 31 is formed into a circular shape corresponding to an outer periphery of the fan 21, and an outer periphery of the top plate portion 31 is formed into approximately a rectangular shape corresponding to the outer periphery of the casing 22. The top plate portion 31 is fastened to the casing 22 at the hole forming portions 33a-33d to be fixed to the main body 2.

The leg portions 32a-32d are formed integrally with the top plate portion 31 at four portions of the top plate portion 31. The four portions of the top plate portion 31, at which the four leg portions 32a-32d are continuously formed, are arranged in the plate member 3 at two opposite side portions without having the outlet ports 22a.

Figure 2:
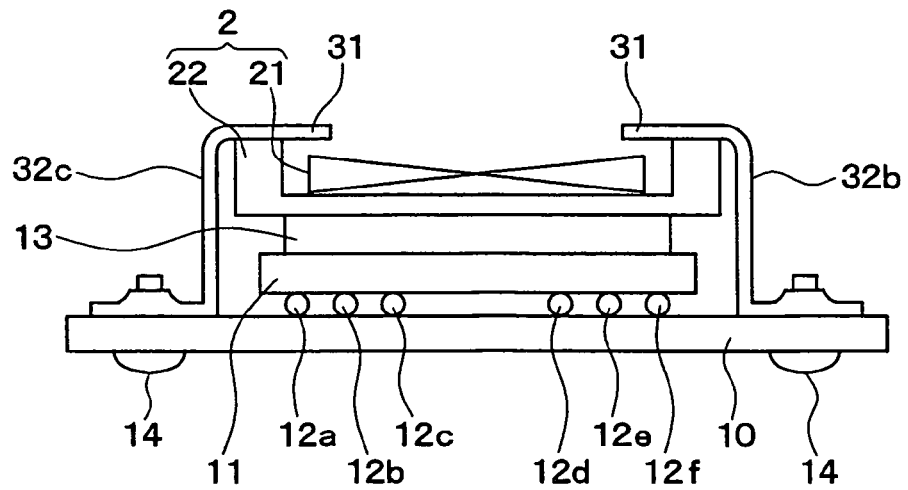
FIG. 2 is a schematic side view showing the radiator when being viewed from II in FIG. 1.

FIG. 2 shows an attachment state of the radiator 1 to the IC chip 11 that is mounted to a substrate 10 by soldering. In FIG. 2, the arrangement structure of the outlet ports 22a are omitted. As shown in FIG. 2, the IC chip 11 is bonded to the substrate 10 at solder portions 12a-12f. Bottom end portions of the leg portions 32a-32d are fixed to the substrate 10 by using screws 14 fastened into screw holes of the substrate 10. In this case, a bottom surface of the casing 22 of the radiator 1 contacts the IC chip 11 through a radiation sheet 13. When the screw connection of the leg portions 32a-32d into the screw holes of the substrate 10 is performed, if the arrangement positions of the screw connection of the led portions 32a-32d do not correspond to the screw holes of the substrate 10, the plate member 3 or the substrate 10 may be deformed. When the deformation of the substrate 10 becomes larger, the solder portions 12a-12f may be cracked and damaged. In this embodiment, the plate member 3 can be formed from a metal plate having a relative low rigidity compared with the substrate 10. For example, the plate member 3 can be made mainly of phosphor bronze, beryllium copper, or a SUS material.

Figure 3:
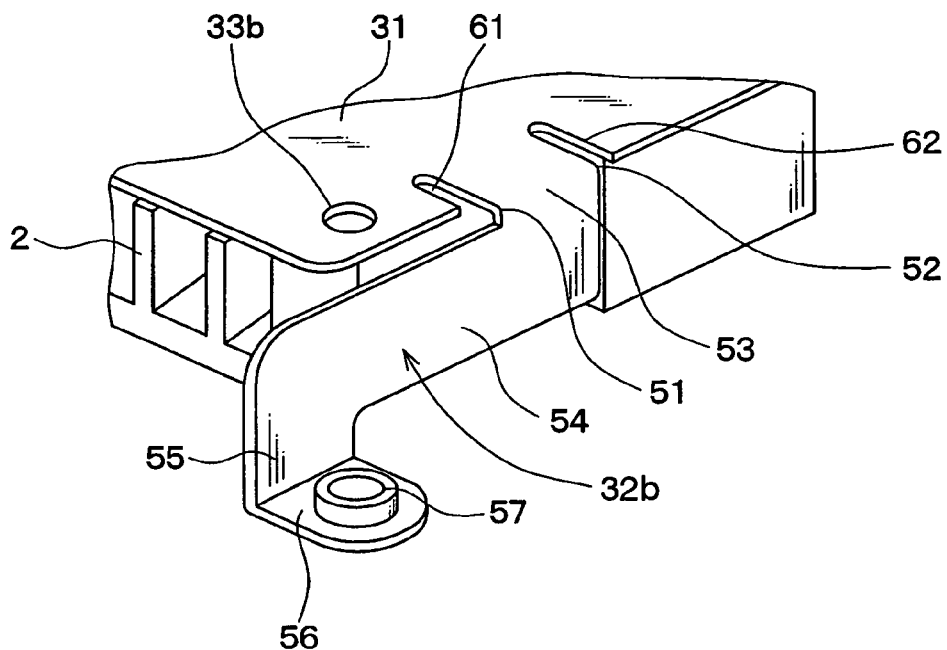
FIG. 3 is an enlarged view showing a leg portion in the radiator of FIG. 1.

Next, the leg portions 32a-32d extending continuously from the periphery of the top plate portion 31 will be described. FIG. 3 is an enlarged view showing a part of the top plate portion 31 and the leg portion 32b. As shown in FIG. 3, the leg portion 32b is connected with the top plate portion 31 at a boundary part 53 between the leg portion 32b and the top plate portion 31. The leg portion 32b includes a first plate 54, a second plate 55 and a third plate 56. The first plate 54 is bent perpendicularly relative to the top plate portion 31 at the boundary part 53 and extends horizontally. The second plate 55 is bent approximately perpendicularly relative to the first plate 54. The plate surface of the second plate 55 is placed on the same surface of the first plate 54, and is approximately perpendicular to the plate surface of the top plate portion 31. The third plate 56 is located at a bottom end of the second plate 55, and has a plate surface approximately perpendicular to the plate surface of the second plate 55.

More specifically, the first plate 54 extends from the boundary part 53 downwardly, and extends horizontally adjacent to the top plate portion 31 in parallel with the plate surface of the top plate portion 31. The first plate 54 is a thin plate having a width in a vertical direction, approximately equal to a thickness of the casing 22 (main body 2). The plate surface of the first plate 54 is substantially perpendicular to the plate surface of the top plate portion 31, and is arranged to contact or adjacent to a side surface of the casing 22.

The second plate 55 is formed integrally with an end portion of the first plate portion 54 and extends to a portion outside of a corner of the top plate portion 31 in the extending direction of the first plate 54. The second plate 55 is bent from the first plate 54 in a direction perpendicular to the extending direction of the first plate 54, and extend to a position of the substrate 10.

Furthermore, the third plate 56 is formed integrally with the bottom end of the second plate 55. The third plate 56 is bent to be perpendicular to the plate surface of the second plate portion 55, and extends in a horizontal direction away from the main body 2. The third plate 56 is horizontal relative to the substrate 10. A burring 57 is provided at a center area of the third plate 56. The burring 57 is provided in the third plate 56 to correspond to the screw hole of the substrate 10. By inserting a screw into the burring 57 of the third plate 56 and the screw hole of the substrate 10, the radiator 1 is assembled to the substrate 10. Two slits 61, 62 are provided in the top plate portion 31 at two ends of a base portion of the leg portion 32b. That is, the two slits 61, 62 are provided in the top plate portion 31 to be recessed from two points 51, 52 corresponding to the ends of the base portion of the leg portion 32b. Furthermore, the slits 61, 62 are recessed in a direction perpendicular to a connection edge of the leg portion 32b with the top plate portion 31.

Each structure of the leg portions 32a, 32c, 32d can be made similar to that of the leg portion 32b shown in FIG. 3. The leg portion 32d has the same structure as the leg portion 32b, and is symmetrical to the leg portion 32b relative to a center of the main body 2. Similarly, the leg portion 32a has the same structure as the leg portion 32c, and is symmetrical to the leg portion 32c relative to the center of the main body 2. Furthermore, similarly to the slits 61, 62, slits can be provided in the top plate portion 31 at positions corresponding to ends of the base portion of each leg portion 32a, 32c, 32d.

The four burrings 57 of the four leg portions 32a-32d can be provided at four positions defining a square shape with a center that corresponds to the center of the fan 21. Accordingly, even when the arrangement position of the radiator 1 is rotated relative to the substrate 10 around an axis perpendicular to the top plate portion 31 by 90 degrees, 180 degrees or 270 degrees, any one burring 57 can be made to correspond to one screw hole of the substrate 10. That is, the radiator 1 can be attached to the substrate 10 with four different arrangement positions.

According to this embodiment, the top plate portion 31 and the leg portions 32a-32d formed integrally with the top plate portion 31 are formed from an elastic plate, and the leg portions 32a-32d are fixed to the substrate 10 at the four positions. The top plate portion 31 and the leg portions 32a-32d have a small rigidity as compared with the substrate 10. Therefore, even when the arrangement positions of the four burrings 57 and the arrangement positions of the four screw holes of the substrate 10 are not identical and are offset from each other, the offset amount can be effectively absorbed by using the deformation of the top plate portion 31 and the leg portions 32a-32d, thereby effectively reducing a deformation of the substrate 10.

Furthermore, because the slits 61, 62 are provided in the top plate portion 31, a bending of the plate member 3 can be easily and smoothly performed. For example, a distance between the burring 57 of the leg portion 32a and the burring 57 of the leg portion 32b is larger than a distance between corresponding screw holes of the substrate 10, the part between the slits 61, 62 is bent so as to absorb the difference. Furthermore, in a case where the height positions of the screw holes of the substrate 10 are the same, if the position height of the burring 57 of the leg portion 32b is higher than that of the leg portions 32a, 32c, 32d, the base portion of the leg portion 32b between the slits 61 and 62 is bent upwardly so as to absorb the height different.

Furthermore, the first plate 54 of each leg portion 32a, 32b, 32c, 32d has a small width and is elongated in a horizontal direction, and the plate surface of the first plate 54 is approximately perpendicular to the plate surface of the top plate portion 31. Therefore, the plate member 3 can be flexibly bent relative to a torsional stress around an axis perpendicular to the surface of the substrate 10. For example, when a distance between the burring 57 of the leg portion 32b and the burring 57 of the leg portion 32c is smaller than a distance between corresponding screw holes of the substrate 10, the first plates 54 of the leg portions 32b, 32c are bent outside respectively so as to absorb the position difference.

Each of the leg portions 32a-32d is bent approximately perpendicularly relative to the top plate portion 31 at the boundary part 53 with the top plate portion 31 so that the plate surfaces of the first plate 54 and the second plate 55 are made perpendicular to the plate surface of the top plate portion 31. In addition, the first plate 54 is arranged to face the side surface of the main body 2 adjacent to the side surface of the main body 2 or to contact the side surface of the main body 2. Therefore, an area of the substrate 10 covered by the leg portion 32 can be made smaller, and the entire size of the radiator 1 can be made smaller.

In this embodiment, the leg portions 32a-32d are bent perpendicularly relative to the plate surface of the top plate portion 31 at the boundary part 53. Accordingly, while the main body 2 is attached to the top plate portion 31 during manufacturing steps of the radiator 1, the leg portions 32a-32d bent relative to the top plate portion 31 can be used as a guide member for guiding the main body 2. Therefore, an arrangement position of the main body 2 to the top plate portion 31 can be easily set.

In the first embodiment, in a manufacturing step of the plate member 3, the first plate 54 of each leg portion 32a-32d is bent at the boundary part 53, and the third plate 56 of each leg portion 32a-32d is bent relative to the second plate 55 thereof. That is, by performing two bending steps of a single plate member, the plate member 3 can be easily formed. Therefore, the manufacturing process of the plate member 3 can be easily performed.

Figure 4:
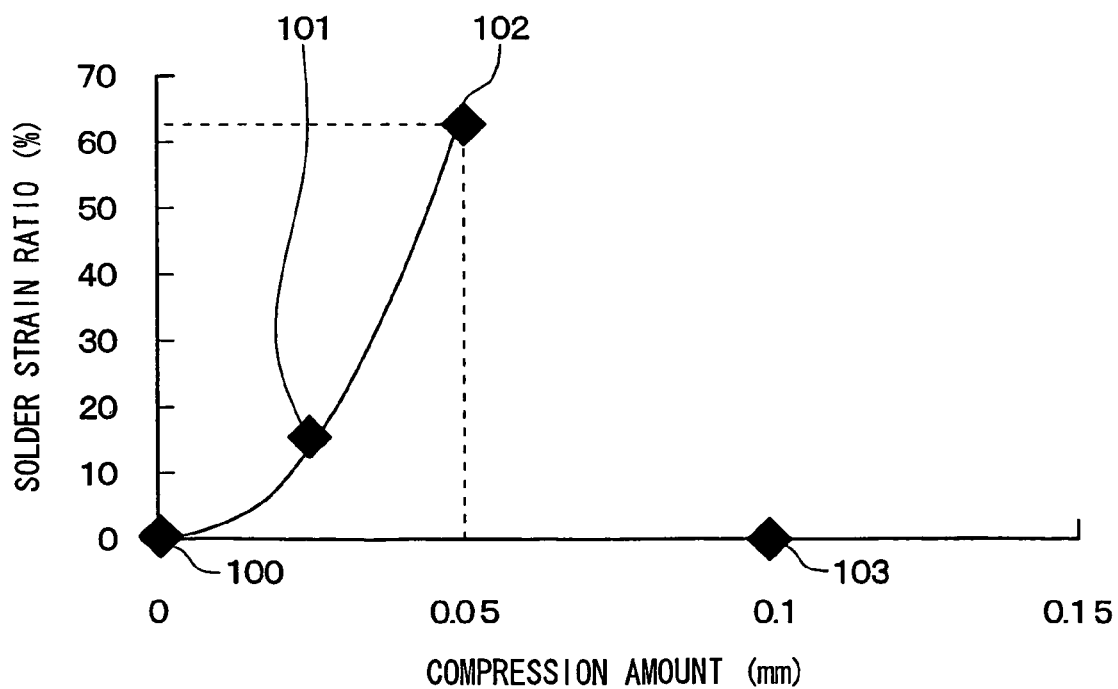
FIG. 4 is a graph showing a solder strain ratio in a case where the radiator of FIG. 1 is attached to a substrate and in a case where a radiator of a comparison example is attached to the substrate.

FIG. 4 shows a strain ratio of a solder portion through which a radiator is attached to a substrate in a case of the first embodiment and in a comparison example where a conventional radiator formed by Aluminum Die Casing is used, when a compression amount of the radiation sheet 13 is changed. Here, the compression amount of the radiation sheet 13 indicates a pressing amount of the radiator 1 to the IC chip 11. The ordinate of FIG. 4 indicates the stress ratio of the solder portion at a corner portion of the IC chip 11. In FIG. 4, the changing points 100, 101, 102 show a change of the strain ratio in the comparison example, and the changing points 100, 103 show a change of the strain ratio in the first embodiment. As shown in FIG. 4, in the first embodiment, the solder strain ratio of the radiator 1 is 0.4% when the compression amount is 0.05 mm, and is greatly reduced as compared with the comparison example.

Second Embodiment

Figure 5:
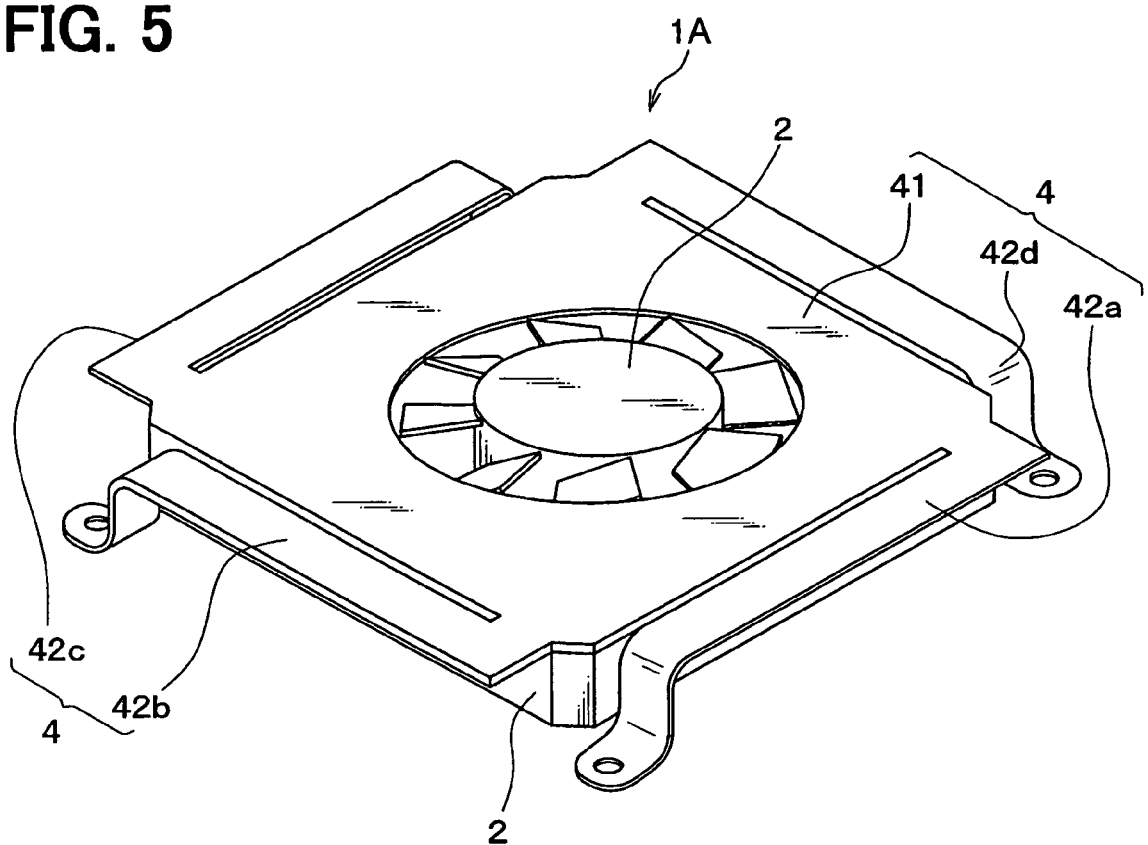
FIG. 5 is a perspective view showing a radiator according to a second embodiment of the present invention.

FIG. 5 shows a radiator 1A of the second embodiment. In the second embodiment, the main body 2 has a structure similarly to the first embodiment. In the radiator 1A, a plate member 4 is attached to the main body 2 to surround a part of a top surface and a side surface of the main body 2. Furthermore, the plate member 4 is formed from a material similar to that of the plate member 3 described in the first embodiment.

As shown in FIG. 5, the plate member 4 includes a top plate portion 41 covering a part of the top surface of the main body 2. The top plate portion 41 has a circular inner periphery surrounding the outer periphery of the fan 21, and an approximate rectangular outer periphery. The plate member 4 further includes four leg portions 42a-42d formed integrally with the top plate portion 41.

Figure 6:
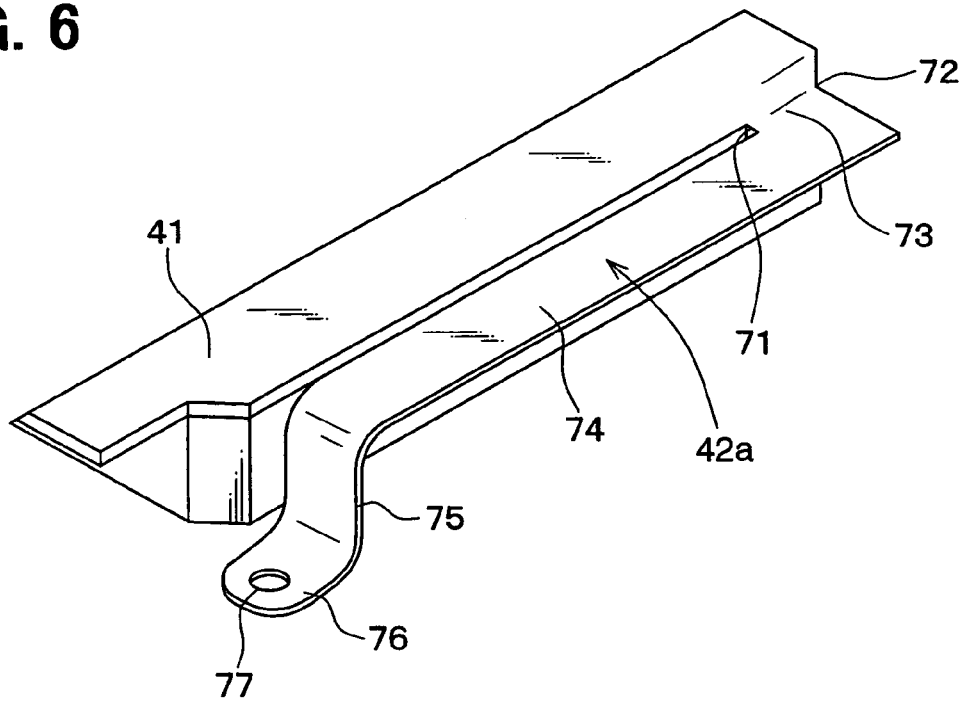
FIG. 6 is an enlarged view showing a leg portion in the radiator of the second embodiment.

Each of the leg portions 42a-42d is formed integrally with a connection position (boundary part 73) of each side end on the outer periphery of the tap plate portion 41. Each of the leg portions 42a-42d extends from the boundary part 73 with the top plate portion 41 approximately on the same plane as a plate surface of the top plate portion 41. FIG. 6 shows the leg portion 42a. As shown in FIG. 6, the leg portion 42a includes a first plate 74 connected to the top plate portion 41 at the boundary part 73 and extending approximately on the same plane as the plate surface of the top plate portion 41, a second plate 75 connected to the first plate 75 and extending in a vertical direction, and a third plate 76 connected to a bottom end of the second plate 75 and extending approximately horizontally.

The first plate 74 has a plate shape, which has a small width and is elongated approximately in a horizontal direction relative to the plate surface of the top plate portion 41. The first plate 74 has a wall thickness approximately equal to that of the casing 22 of the main body 2. Furthermore, the first plate 74 is arranged to contact a side surface of the casing 22 or adjacent to the side surface of the casing 22. In addition, the first plate 74 extends continuously from the connection portion at one end portion of the square-shaped top plate portion 41 to the other end portion thereof opposite to the one end portion.

The second plate 75 is formed integrally with the first plate 74 to be bent approximately perpendicularly at a boundary between the first plate 74 and the second plate 75. The second plate 75 bent from the first plate 74 extends to a position contacting the substrate 10.

The third plate 76 is formed integrally with the bottom end of the second plate portion 75, and is bent approximately perpendicularly to the second plate 75 in a direction separating from the first plate 74. Therefore, the third plate 76 has a plate surface horizontal relative to the substrate 10. The third plate 76 has a burring 77 corresponding to the burring 57 of the first embodiment. Each of the leg portions 42b, 42c and 42d has a structure similar to the leg portion 42a.

According to the second embodiment, the top plate portion 41 and the leg portions 42a-42d formed integrally with the top plate portion 41 are formed from an elastic plate, and the leg portions 42a-42d are fixed to the substrate 10 at the four positions. The top plate portion 41 and the leg portions 42a-42d have a small rigidity as compared with the substrate 10. Therefore, even when the arrangement positions of the four burrings 77 and the arrangement positions of the four screw holes of the substrate 10 are not identical and are offset from each other, the offset amount can be absorbed by bending of the top plate portion 41 and the leg portions 42a-42d, thereby effectively reducing a deformation of the substrate 10.

Furthermore, the first plate 74 of each leg portion 42a, 42b, 42c, 42d has a small width and is elongated in a horizontal direction that is horizontal with respect to the plate surface of the top plate portion 41. Therefore, the plate member 4 can be flexibly bent relative to a torsional stress around an axis perpendicular to the surface of the substrate 10. For example, when a distance between the burring 77 of the leg portion 42a and the burring 77 of the leg portion 42b is smaller than a distance between corresponding screw holes of the substrate 10, the first plate 74 of the leg portions 42a is opened outside of the main body 2, so as to absorb the position difference.

In the second embodiment, the plate member 4 constructed with the top plate portion 41 and the leg portions 42a-42d can be flexibly bent in a vertical direction. For example, in a case where the height positions of the screw holes of the substrate 10 are the same, when the height position of the burring 77 of the leg portion 42a is lower than the height position of the burring 77 of each of the leg portions 42b, 42c, 42d, the first plate 74 of the leg portion 42a is bent upwardly so as to absorb the height difference.

In the second embodiment, the other parts can be made similar to that of the above-described first embodiment.

Other Embodiments

Although the present invention has been described in connection with some preferred embodiments thereof with reference to the accompanying drawings, it is to be noted that various changes and modifications will become apparent to those skilled in the art.

Figure 7:
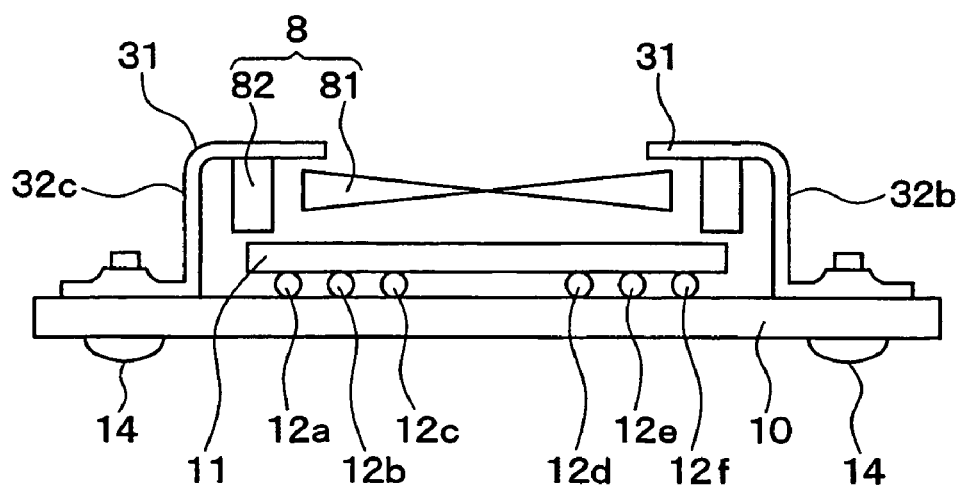
FIG. 7 is a schematic side view showing a radiator according to a modification of the present invention.
Figure 8:
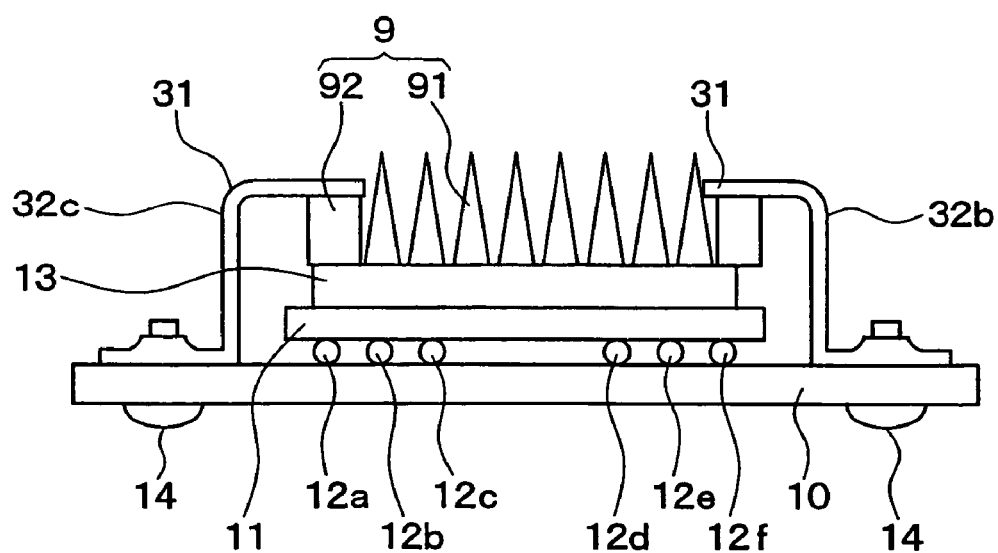
FIG. 8 is a schematic side view showing a radiator according to another modification of the present invention.

For example, in the above-described embodiments, air is drawn by the fan 21 from an upper side of the main body 2 and is discharged from the side of the main body 2, so that heat from the IC chip 11 contacting a bottom surface of the casing 22 through the radiation sheet 13 is radiated. However, this structure can be changed as shown in FIGS. 7 and 8, for example. In the example of FIG. 7, a main body 8 includes a fan 81 surrounded by a casing 82, and the IC chip 11 is arranged such that air drawn from an upper side of the main body 2 directly contacts the IC chip 11 to cool the IC chip 11. The air after directly contacting the IC chip 11 can be discharged from a side of the casing 82.

In the example of FIG. 8, a main body 9 includes a plurality of radiation fins 91 enclosed by a casing 92. The radiation fins 91 are disposed to perform heat exchange with the IC chip 11 through the radiation sheet 13 so that heat from the IC chip 11 is radiated outside through the radiation fins 91. In the radiator shown in FIG. 7 or 8, the other parts can be made similarly to those of the above-described embodiments.

The material for forming the main body 2 can be suitably changed only when the material has a lower rigidity than a general substrate. For example, the main body 2 can be formed from a metal plate or a resin plate having an elasticity (flexibility) larger than that of the substrate.

The radiator 1, 1A for a semiconductor can be used for an electrical device for a house, a communication device or a portable device, etc. Furthermore, the arrangement state of the radiator 1, 1A attached to the substrate 10 is not limited to the horizontal arrangement state. For example, the substrate 10 can be arranged vertically. In this case, the top plate portion 31, 41 is a plate portion attached to one surface of the main body 2, opposite to the substrate 10. That is, the arrangement state of the radiator 1, 1A attached to the substrate 10 can be suitably changed in accordance with a used state.

The shapes of the leg portions 32a-32d, 42a-42d described in the above embodiments can be suitably changed. When the leg portions 32a-32d, 42a-42d are integrated with the top plate portion 31, 41, and when the leg portions 32a-32d, 42a-42d and the top plate portion 31, 41 are formed flexibly to have elasticity, a deformation stress of the substrate 10 can be effectively reduced. For example, in the above-described first embodiment, the leg portions 32a-32d are connected at positions of the top plate portion 31, adjacent to the corner portions and extend toward the adjacent corner portions, respectively. However, the leg portions 32a-32d can be provided to extend to opposite corner portions.

In the above-described first embodiment, the bending angle between the top plate portion 31 and the first plate 54 or the bending angle between the second plate 55 and the third plate 56 can be set at an angle different from the right angle. The first plate 54 can be elongated in a direction tilted from the horizontal direction. In addition, the second plate 55 can extend in a direction tilted from the vertical direction.

In the above-described embodiments, the radiator 1, 1A is typically used for radiating heat generated from a semiconductor. However, the radiator 1, 1A can be used for radiating heat from a heat generating member attached to a board, such as an electrical member. Furthermore, the substrate 10 provided with the radiator 1, 1A can be used in a state different from the horizontal state in FIG. 2.

While the invention has been described with reference to preferred embodiments thereof, it is to be understood that the invention is not limited to the preferred embodiments and constructions. The invention is intended to cover various modification and equivalent arrangements. In addition, while the various elements of the preferred embodiments are shown in various combinations and configurations, which are preferred, other combinations and configuration, including more, less or only a single element, are also within the spirit and scope of the invention.

What is claimed is:

1. A radiator for a semiconductor, comprising:
a main body which is provided for radiating heat from the semiconductor mounted to a substrate; and
a plate member attached to the main body, the plate member having an elasticity relative to the substrate, wherein:
the plate member includes a plate portion that covers a part of a top surface of the main body, opposite to the substrate, and a leg portion extending from an outer periphery of the plate portion and fixed to the substrate
the leg portion has a base part at a boundary with the plate portion;
the plate portion has a slit recessed from the outer periphery of the plate portion at least at an end of the base part; and
the slit is provided in the plate portion covering the top surface and extends from the outer periphery of the plate portion to a location spaced from the outer periphery of the plate portion.

2. The radiator according to claim 1, wherein the leg portion is bent relative to the plate portion on the outer periphery of the plate portion.

3. The radiator according to claim 2, wherein the leg portion is bent approximately to be perpendicular to a plate surface of the plate portion.

4. The radiator according to claim 1, wherein the leg portion includes a first plate, which is elongated in a direction that is parallel to a plane of the substrate.

5. The radiator according to claim 4, wherein a plane of the first plate is approximately perpendicular to the plate portion.

6. The radiator according to claim 4, wherein a plane of the first plate is approximately coplanar with the plate portion.

7. The radiator according to claim 4, wherein the first plate is adjacent to and faces a side surface of the main body.

8. The radiator according to claim 1, wherein:
the outer periphery of the plate portion has approximately a square shape; and
the leg portion includes four leg parts fixed to the substrate at four positions separated from a center by the same distance.

9. The radiator according to claim 1, wherein the plate member is made mainly of one of phosphor bronze, beryllium copper and a SUS material.

10. The radiator according to claim 4, wherein the leg portion has a thickness approximately equal to that of the plate portion.

11. The radiator according to claim 4, wherein:
the leg portion further includes a second plate bent relative to the first plate to have a plate surface on the same surface as the plate surface of the first plate and a third plate bent relative to the plate surface of the second plate; and
the third plate is attached to the substrate.

12. The radiator according to claim 4, wherein:
the leg portion further includes a second plate bent relative to the first plate to have a plate surface approximately perpendicular to the plate surface of the first plate and a third plate bent relative to the plate surface of the second plate; and
the third plate is attached to the substrate.

13. The radiator according to claim 1, wherein the plate portion has a circular inner periphery defining an opening from which a part of the main body is exposed.

14. A radiator for a semiconductor comprising:
a main body which is provided for radiating heat from the semiconductor mounted to a substrate; and
a plate member attached to the main body, the plate member having an elasticity relative to the substrate, wherein:
the plate member includes a plate portion having approximately a square-shaped outer periphery and covering a part of one surface of the main body opposite to the substrate, and four leg parts each of which extends from the outer periphery and is fixed to the substrate;
the four leg parts are arranged approximately symmetrically with respect to a center of the main body;
each of the four leg parts has a base portion continuously extending from the plate portion at the outer periphery, and includes a first plate extending from the base portion, a second plate connected with the first plate and a third plate connected with the second plate;
the first plate has a plate surface approximately perpendicular to a plate surface of the plate portion, and the plate surface of the first plate has a width approximately equal to a thickness of the main body;
the second plate is bent relative to the first plate while having a plate surface on the same surface as the plate surface of the first plate;
the third plate is bent to have a plate surface that is approximately perpendicular to the plate surface of the second plate; and
the third plate is attached to the substrate.

15. The radiator according to claim 1, wherein the slit is one of two slits provided at opposite ends of a boundary part, which is between a top portion of the plate member and the leg portion, and both of the slits extend in the plate member.

16. The radiator according to claim 1, wherein the top portion of the plate member is approximately parallel to a surface of the substrate, and the slit is provided in the plate member to be parallel with the surface of the substrate.

17. The radiator according to claim 16, wherein the top portion of the plate member is approximately perpendicular to a surface of the leg portion.

18. The radiator according to claim 1, wherein the slit is one of two slits, which are located at opposite sides of the base part of the leg, and the slits are parallel to one another.

19. The radiator according to claim 18, wherein the slits extend in a direction that is parallel to a plane of the substrate.

20. The radiator according to claim 18, wherein the leg is elongated such that a longitudinal axis of the leg is parallel to the plane of the substrate.

* * * * *